United States Patent [19]

Lee

[11] Patent Number: 5,532,578
[45] Date of Patent: Jul. 2, 1996

[54] REFERENCE VOLTAGE GENERATOR UTILIZING CMOS TRANSISTOR

[75] Inventor: Seung-Hun Lee, Suwon, Rep. of Korea

[73] Assignee: Samsung Electronics Co., Ltd., Suwon, Rep. of Korea

[21] Appl. No.: 68,546

[22] Filed: May 28, 1993

[30] Foreign Application Priority Data

May 30, 1992 [KR] Rep. of Korea ............... 9411/1992

[51] Int. Cl.$^6$ .................................................. G05F 3/16
[52] U.S. Cl. ................................... 323/313; 327/538
[58] Field of Search ................................. 323/312, 313, 323/314; 327/530, 538, 542

[56] References Cited

U.S. PATENT DOCUMENTS

| | | | |
|---|---|---|---|
| 3,781,648 | 12/1973 | Owens . | |
| 4,339,707 | 7/1982 | Gorecki | 323/313 |
| 4,617,497 | 9/1986 | Ulmer | 323/315 |
| 4,839,535 | 6/1989 | Miller | 307/296.7 |
| 4,849,684 | 7/1989 | Sonntag et al. | 323/313 |
| 5,030,903 | 7/1991 | Bernard et al. | 323/313 |
| 5,206,581 | 4/1993 | Yoshida | 323/313 |

*Primary Examiner*—Peter S. Wong
*Assistant Examiner*—Adolf Berhane

[57] ABSTRACT

A reference voltage generating circuit for converting a first source voltage to a second source voltage includes a positive thermal compensation circuit connected between the first source voltage and ground voltage and having a positive thermal coefficient for positively compensating the second source voltage with respect to temperature variations, and a negative thermal compensation circuit responsive to the output of the positive thermal compensation circuit and having a negative thermal coefficient for negatively compensating the second source voltage with respect to temperature variations, wherein the positive and negative thermal coefficients counter-balance each other so as to stabilize the second source voltage.

17 Claims, 5 Drawing Sheets

REFERENCE VOLTAGE GENERATOR UTILIZING CMOS TRANSISTOR

BACKGROUND OF THE INVENTION

The present invention relates to a reference voltage generating circuit including CMOS transistors for compensating the reference voltage output for variations of temperature and the external source voltage level.

The miniaturization of semiconductor memory devices of high complexity requires a reference voltage generating circuit for supplying an internal reference voltage lower by a given value than an external source voltage. In this connection, it is required that the reference voltage generating circuit provide a stable reference voltage regardless of variations of environmental temperature, external source voltage, process parameters, etc. To this end, there has been proposed a band-gap reference voltage generating circuit as shown in FIG. 1.

With reference to FIG. 1, the proposed band-gap reference voltage generating circuit includes first, second, and third bipolar transistors 14, 20 and 22, respectively, supplied with a current via a current supply resistor 24. The first transistor 14 has a diode-connected collector-base and is connected between a reference voltage terminal Vref and a ground voltage terminal Vss. The second transistor 20 has a base connected through a node 12 to the collector of the first transistor 14, a collector connected through a resistor 16 to the reference voltage terminal Vref, and an emitter connected through a resistor 21 to the ground voltage terminal Vss. The proposed band-gap reference voltage generating circuit also includes a resistor 10 connected between the node 12 and the reference voltage terminal Vref.

The third transistor 22 has a collector connected to the reference voltage terminal Vref, an emitter connected to the ground voltage terminal Vss, and a base connected to the collector of the second transistor 20. This circuit causes the base-emitter voltage ($\partial V_{BE}/\partial T \cong -2.2$ mV/°C.) with a negative thermal coefficient to counterbalance the thermal voltage ($V_T = Kt/1$, $\partial Vt/\partial T = 0.086$ mV/°C.) with a positive thermal coefficient in order to generate a stable reference voltage output with respect to temperature variations. More particularly, the reference voltage Vref is the sum of the voltage V1 across the resistor 16 and the base-emitter voltage $V_{BE22}$ of the third transistor 22. The voltage V1 depends on the variation $\Delta V_{BE20}$ of the base-emitter voltage of the second transistor 20. Assuming that the resistors 16 and 21 are respectively R16 and R21 and that the currents passing through the resistors 21 and 10 are respectively I1 and I2, Eqs. (1) and (2) may be obtained as follows:

$$\Delta V_{BE20} = I1 \cdot R21 = V_{BE14} - V_{BE20} = V_T \ln(I2/I1) \quad (1)$$

$$V1 = (R16/R21) \cdot \Delta V_{BE20} = V_T \cdot (R16/R21) \ln(I2/I1) \quad (2)$$

where, $V_T$ (=kt/q) is the thermal voltage with a positive thermal coefficient, k is the Boltzman constant, T is the absolute temperature, and q is the charge quantity. Hence, the reference voltage Vref is determined by the base-emitter voltage $V_{BE22}$ of the third transistor 22 with the negative thermal coefficient and the thermal voltage $V_T$ with the positive thermal coefficient, as expressed by the following Eq. (3).

$$Vref = V_{BE22} + V_T (R16/R21) \quad (3)$$

Thus, the reference voltage Vref is stabilized with respect to temperature variations. Moreover, the bipolar transistors work depending on the relatively stable base-emitter voltage $V_{BE22}$ of the third transistor 22, which is operated in its saturation region, thereby providing a relatively stable reference voltage with respect to variations of the external source voltage.

However, dynamic random access memory devices (DRAMs) which employ the above-described bandgap reference voltage generating circuit require a back bias generator to supply a negative substrate voltage $V_{BB}$, in order to stabilize the substrate voltage. The back bias generator works only when the substrate voltage $V_{BB}$ exceeds a given value. The substrate voltage $V_{BB}$ is undesirably transferred via the polysilicon resistors of the band-gap reference voltage generating circuit and parasitic capacitances formed in the substrate to the respective circuit connections, thus varying the reference voltage output Vref. Moreover, the transistors used in the circuit operate in a saturation mode, thus undesirably increasing the standby current. In addition, if the band-gap reference voltage generating circuit is used in a DRAM device, an additional processing step for forming the bipolar transistors is required. Further, as shown by curve 112 in FIG. 6, the band-gap reference voltage generating circuit has a high set-up voltage (about 2.5 V) and exhibits large fluctuations of the reference voltage with respect to temperature variations, at low external source voltage levels.

FIG. 2 depicts another conventional reference voltage generating circuit, which includes a plurality of PMOS transistors 26, 28, 32, 34, 36, 40, and 42. The PMOS transistors 26, 28 and 32 are connected in series and each have diode-connected gates and drains, thereby producing the threshold voltage Vtp of the PMOS transistor 32 at node 30. The PMOS transistors 40 and 42 are connected in series and each have diode-connected gates and drains, thereby producing the output reference voltage 2Vtp at the reference voltage terminal 38. The voltage Vtp at the node 30 is applied to the gates of the PMOS transistors 34 and 36 which are connected in series, to thereby stabilize the reference voltage with respect to external source voltage variations. However, this reference voltage generating circuit does not compensate for variations of the reference voltage due to temperature variations.

SUMMARY OF THE INVENTION

It is therefore an object of the present invention to provide a reference voltage generating circuit using CMOS transistors for generating a stable reference voltage with respect to variations of temperature and the external source voltage level.

It is another object of the present invention to provide a reference voltage generating circuit using CMOS transistors for generating a stable reference voltage, and which is characterized by low power consumption and a low set-up voltage.

It is yet another object of the present invention to provide a reference voltage generating circuit without bipolar transistors, thereby facilitating ease of fabrication with respect to DRAMs or the like.

The present invention encompasses a reference voltage generating circuit for converting a first source voltage to a second source voltage, which includes a positive thermal compensation circuit connected between the first source voltage and ground voltage and having a positive thermal coefficient for positively compensating the second source voltage with respect to temperature variations, and a negative thermal compensation circuit with a negative thermal coefficient for negatively compensating the second source voltage with respect to temperature variations, in response to the output of the positive thermal compensation circuit, whereby the positive and negative thermal coefficients counterbalance each other so as to stabilize the second source voltage.

In one aspect of the present invention, the reference voltage generating circuit further includes a feedback circuit for feeding-back the second source voltage to the positive thermal compensation circuit to assist in stabilizing the second source voltage.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Figure 1:
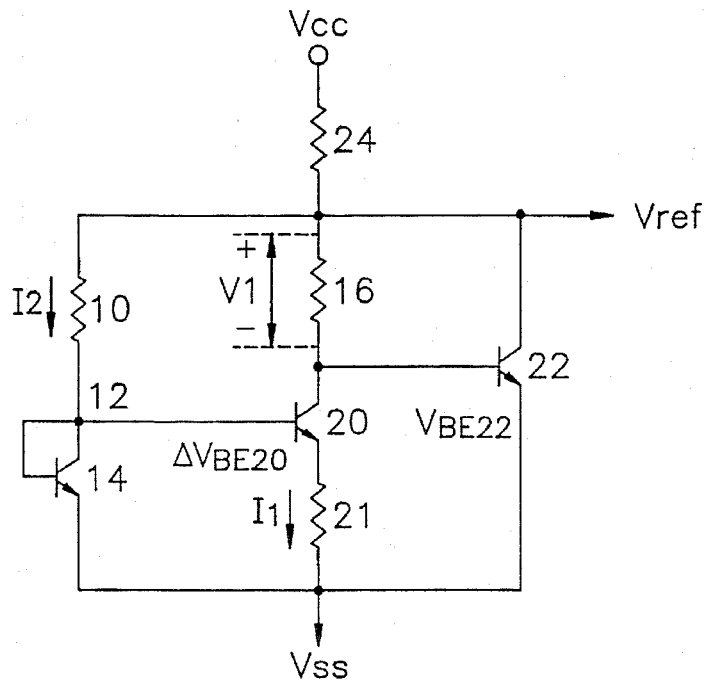
FIG. 1 is a schematic diagram of a conventional band-gap reference voltage generating circuit.
Figure 2:
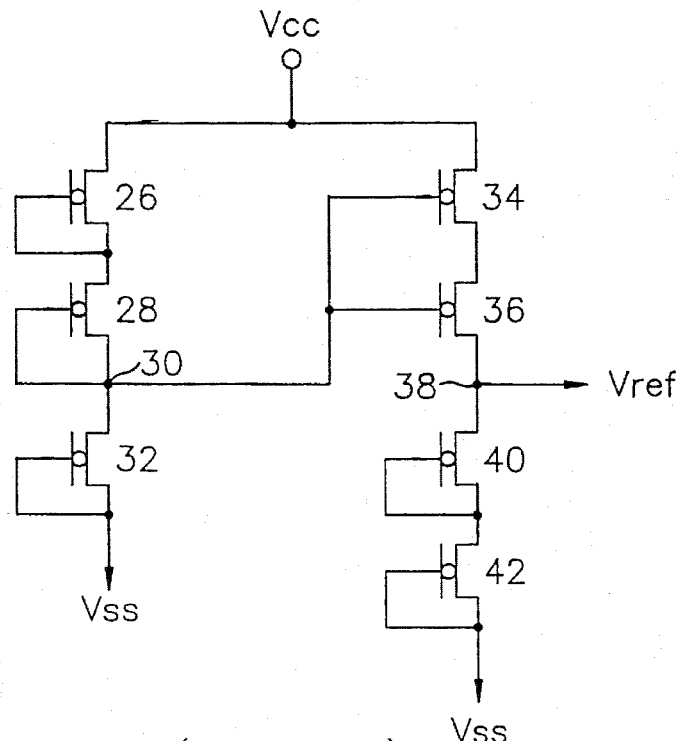
FIG. 2 is a schematic diagram of another conventional reference voltage generating circuit.
Figure 3:
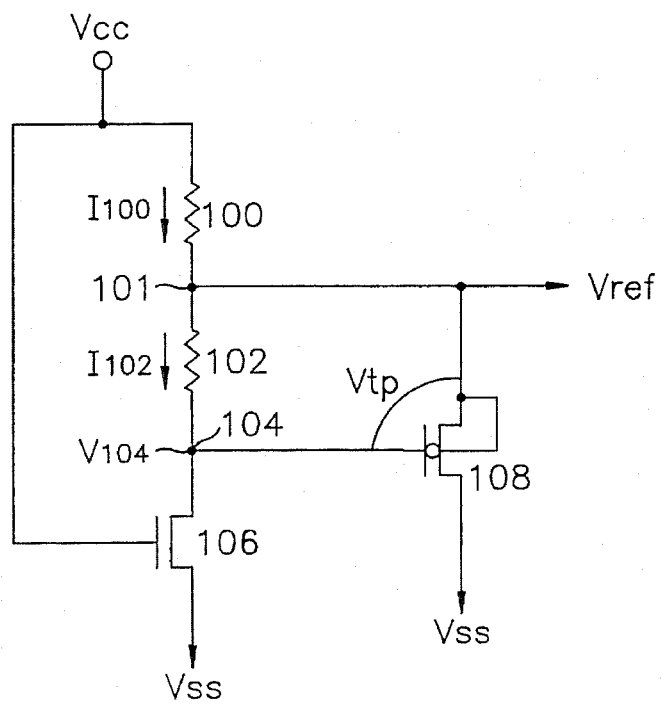
FIG. 3 is a schematic diagram of a reference voltage generating circuit constructed in accordance with a first preferred embodiment of the present invention.

With reference now to FIG. 3, a reference voltage generating circuit constructed in accordance with a first preferred embodiment of the present invention will now be described. More particularly, first and second resistors 100 and 102 and the channel of an NMOS transistor 106 are connected in series between an external source voltage terminal Vcc and ground voltage terminal Vss. The gate of the NMOS transistor 106 is connected to the source voltage terminal Vcc. The channel of a PMOS transistor 108 is connected between a reference voltage terminal Vref and the ground voltage terminal Vss, and the gate of the PMOS transistor 108 is connected to node 104 between the second resistor 102 and the drain of the NMOS transistor 106. The reference voltage terminal Vref is also connected to node 101 between the first and second resistors 100 and 102. The substrate (back gate) of the PMOS transistor 108 is connected to the reference voltage Vref instead of the source voltage Vcc, because if the substrate where connected to the external source voltage Vcc, an increase of the external source voltage Vcc would increase the threshold voltage of the PMOS transistor 108, thereby resulting in an increase of the reference voltage Vref, a phenomenon which is often referred to as the "body effect." Thus, connecting the back gate of the PMOS transistor 108 to the reference voltage Vref eliminates this undesirable "body effect."

In operation, the NMOS transistor 106 is normally turned on due to its gate being connected to the external source voltage Vcc, thus causing a current I102 to flow through the path formed of the first and second resistors 100 and 102 and the channel of the NMOS transistor 106. Consequently, the level of voltage V104 at the node 104 is made low enough to turn on the PMOS transistor 108. The output reference voltage Vref is the sum of the voltage V104 and the turn-on voltage Vtp(on) of the PMOS transistor 108. During operation, if the external source voltage Vcc increases, the transconductance Gm of the NMOS transistor 106 is also increased, due to the corresponding increase of its gate voltage. Accordingly, the voltage V104 at the node 104 is lowered, thereby turning on the PMOS transistor 108 harder so that the threshold voltage Vtp of the PMOS transistor 108 formed across the second resistor 102 prevents the reference voltage output Vref from increasing. Alternatively, if the external source voltage decreases, the transconductance Gm of the NMOS transistor 106 is also decreased due to the decrease of its gate voltage. Accordingly, the voltage V104 at the node 104 is increased so as to slightly turn off the PMOS transistor 108, thereby preventing the reference voltage output Vref from decreasing. Thus, the inventive circuit provides a stable reference voltage output Vref with respect to variations of the external source voltage Vcc.

The thermal compensation mechanism of the above-described circuit of the present invention will now be described. More particularly, when the PMOS transistor 108 is turned on under the normal condition of the circuit, the current I102 flowing through the second resistor R102 may be expressed by the following Eq. (4):

$$I102 = Vtp/R102 \tag{4}$$

where Vtp represents the threshold or turn-on voltage of the PMOS transistor 108, which is well known in the art to have a negative thermal coefficient, i.e., Vtp is inversely proportional to temperature. By contrast, the channel resistance of the NMOS transistor 106 has a positive thermal coefficient because it increases with temperature due to the corresponding decrease of the mobility of the carriers in the channel. Thus, while the channel resistance of the NMOS transistor 106 increases with temperature resulting in the increase of the voltage V104 at the node 104, the threshold voltage Vtp of the PMOS transistor 108 decreases with temperature, so as to provide a stable constant reference voltage output Vref. Hence, the reference voltage output Vref is maintained at a substantially constant level regardless of temperature variations, by virtue of the positive thermal coefficient of the NMOS transistor 106 counterbalancing the negative thermal coefficient of the PMOS transistor 108.

It should be appreciated that since the inventive circuit utilizes CMOS transistors, its stand-by current is significantly less than that of the conventional reference voltage generators described hereinbefore, and further does not require any separate complicated processing steps to be incorporated into DRAMs. The set-up voltage level of the circuit is determined by Eqs. (5) and (6).

$$I100 > I102 \tag{5}$$

$$Vcc > (R100/R102) \cdot Vtp + Vref \tag{6}$$

The set-up voltage must be equal to or higher than the sum of the reference voltage Vref and the voltage V100 across the first resistor R100, which is lower than that of the band-gap reference voltage generating circuit using bipolar transistors. For example, the set-up voltage of the inventive reference voltage generating circuit may be set to approximately 1.6 V.

Figure 4:
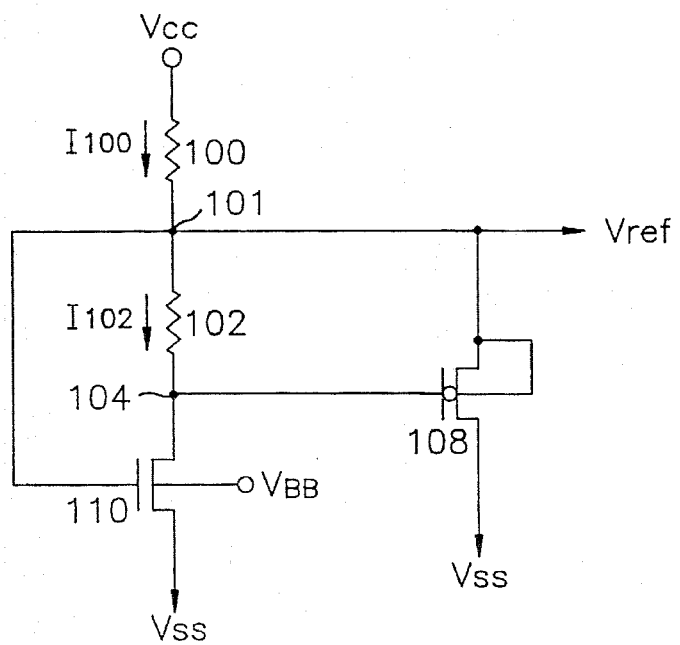
FIG. 4 is a schematic diagram of a reference voltage generating circuit constructed in accordance with a second preferred embodiment of the present invention.

With reference now to FIG. 4, a reference voltage generating circuit constructed in accordance with a second preferred embodiment of the present invention will now be described. More particularly, first and second resistors R100 and R102 and the channel of the NMOS transistor 110 are connected in series between the external source voltage terminal Vcc and ground voltage Vss. The gate of the NMOS transistor 110 is connected to the node 101 between the first and second resistors 100 and 102. The channel of the PMOS transistor 108 is connected between the reference voltage terminal Vref and the ground voltage terminal Vss, and the gate of the PMOS transistor 108 is connected to the drain of the NMOS transistor 110. The substrate of the PMOS transistor 108 is also connected to the reference voltage Vref in order to prevent the "body effect". As can be readily seen, the primary difference between the instant embodiment depicted in FIG. 4 and the first preferred embodiment depicted in FIG. 3 is that, in the instant embodiment, the gate of the NMOS transistor 110 is coupled to the reference voltage Vref so as to feedback the reference voltage Vref, to the gate of the NMOS transistor 110, thereby further stabilizing the reference voltage Vref.

Figure 5:
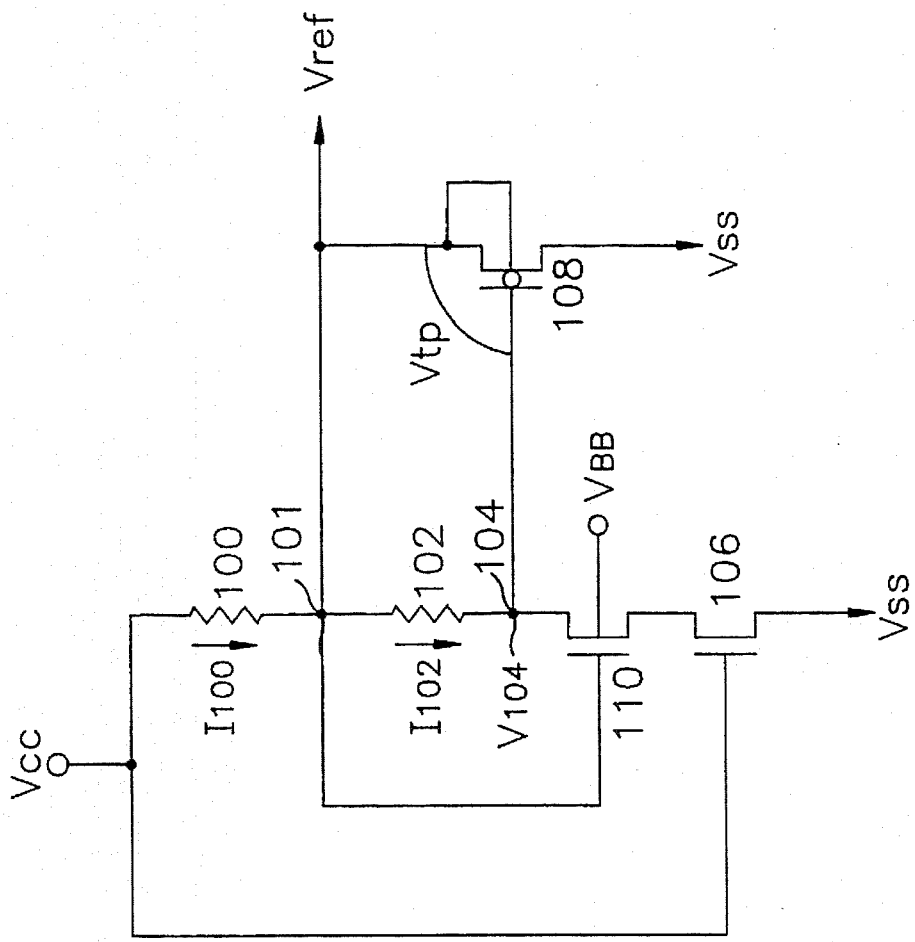
FIG. 5 is a schematic diagram of a reference voltage generating circuit constructed in accordance with a third preferred embodiment of the present invention.

With reference now to FIG. 5, a reference voltage generating circuit constructed in accordance with a third preferred embodiment of the present invention will now be described. More particularly, the first and second resistors R100 and R102 and the channels of the NMOS transistors 110 and 106 are connected in series between the external source voltage terminal Vcc and ground voltage terminal Vss. The gate of the NMOS transistor 106 is connected to the source voltage Vcc and the gate of the NMOS transistor 110 is connected to the node 101 between first and second resistors 100 and 102. The node 101 is also coupled to the reference voltage Vref. The channel of the PMOS transistor 108 is connected between the reference voltage Vref and ground voltage terminal Vss, and the gate of the PMOS transistor 108 is connected to the node 104 between the second resistor 102 and the drain of the NMOS transistor 110. As can be readily seen, the present embodiment is obtained by combining the embodiments of FIGS. 3 ad 4. The additional NMOS transistor 106 assists in stabilizing the reference voltage even with increase of the substrate voltage $V_{BB}$.

In this connection, in the second preferred embodiment depicted in FIG. 4, if the external source voltage Vcc increases, the substrate voltage applied to the substrate of the NMOS transistor 110 is also increased. Then, as in the case of the PMOS transistor 108, the "body effect" increases the channel resistance of the NMOS transistor 110, whereby the reference voltage Vref increases a result of the voltage at the node 104 being increased. However, in the third preferred embodiment depicted in FIG. 5, the increase of the external source voltage Vcc decreases the channel resistance of the additional NMOS transistor 106, so as to compensate for the increase in the channel resistance of the NMOS transistor 110, to thereby maintain the voltage of the node 104 constant, thus minimizing the variation of the reference voltage output Vref. The additional NMOS transistor 106 may be omitted in conjunction with a circuit for generating a relatively low reference voltage. The present embodiment is particularly effective in minimizing the variation of the reference voltage Vref in applications where the source voltage is relatively high.

Figure 7A:
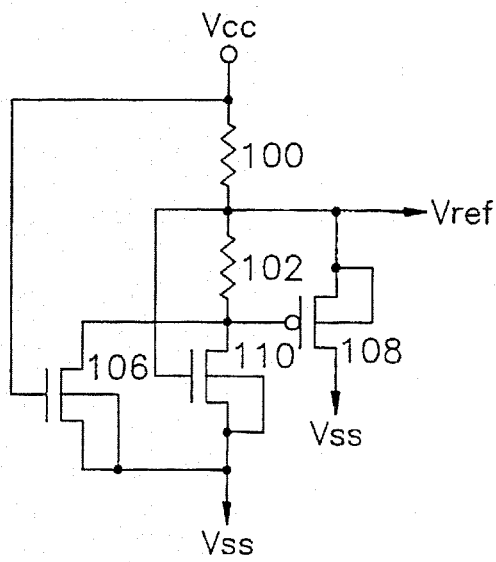
Figure 7B:
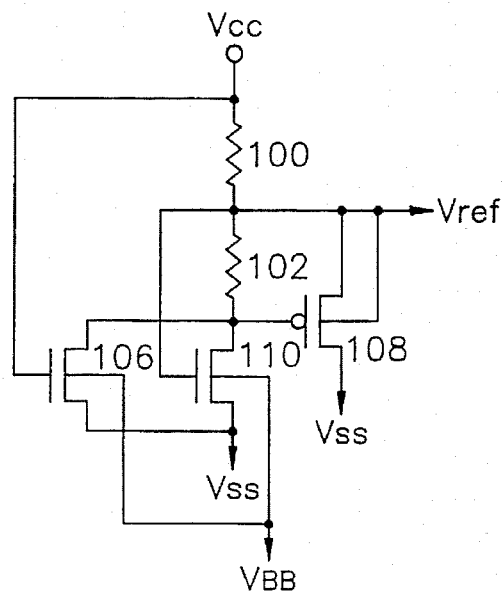
Figure 7C:
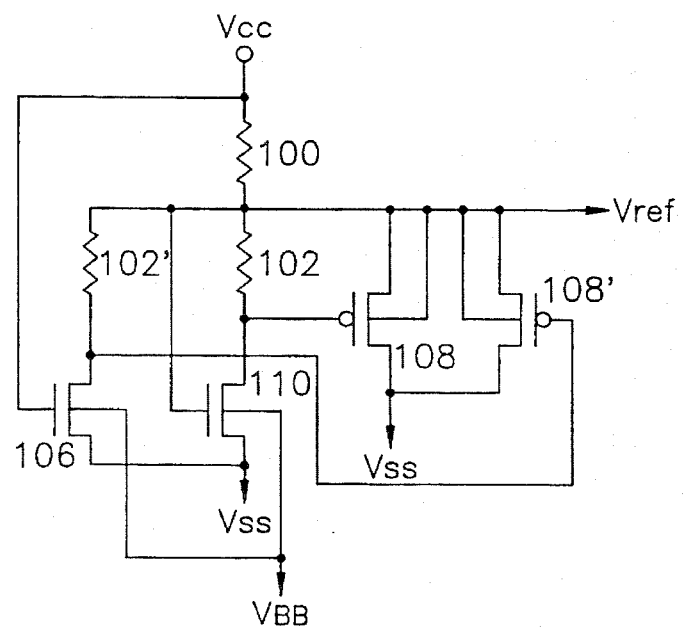

With reference now to FIGS. 7A-7C, various other embodiments of the present invention are illustrated. In the embodiments illustrated in FIGS. 7A and 7B, the NMOS transistors 110 and 106 are connected in parallel to each other, and the substrates thereof are connected to the ground voltage terminal Vss and the back-bias voltage terminal $V_{BB}$, respectively. In the embodiment depicted in FIG. 7C, a PMOS transistor 108' is connected in parallel to the PMOS transistor 108, whose gate is connected to a node between the drain of the NMOS transistor 106 and a resistor 102'. The resistor 102' is connected between the reference voltage output Vref and the drain of the NMOS transistor 106.

Figure 6:
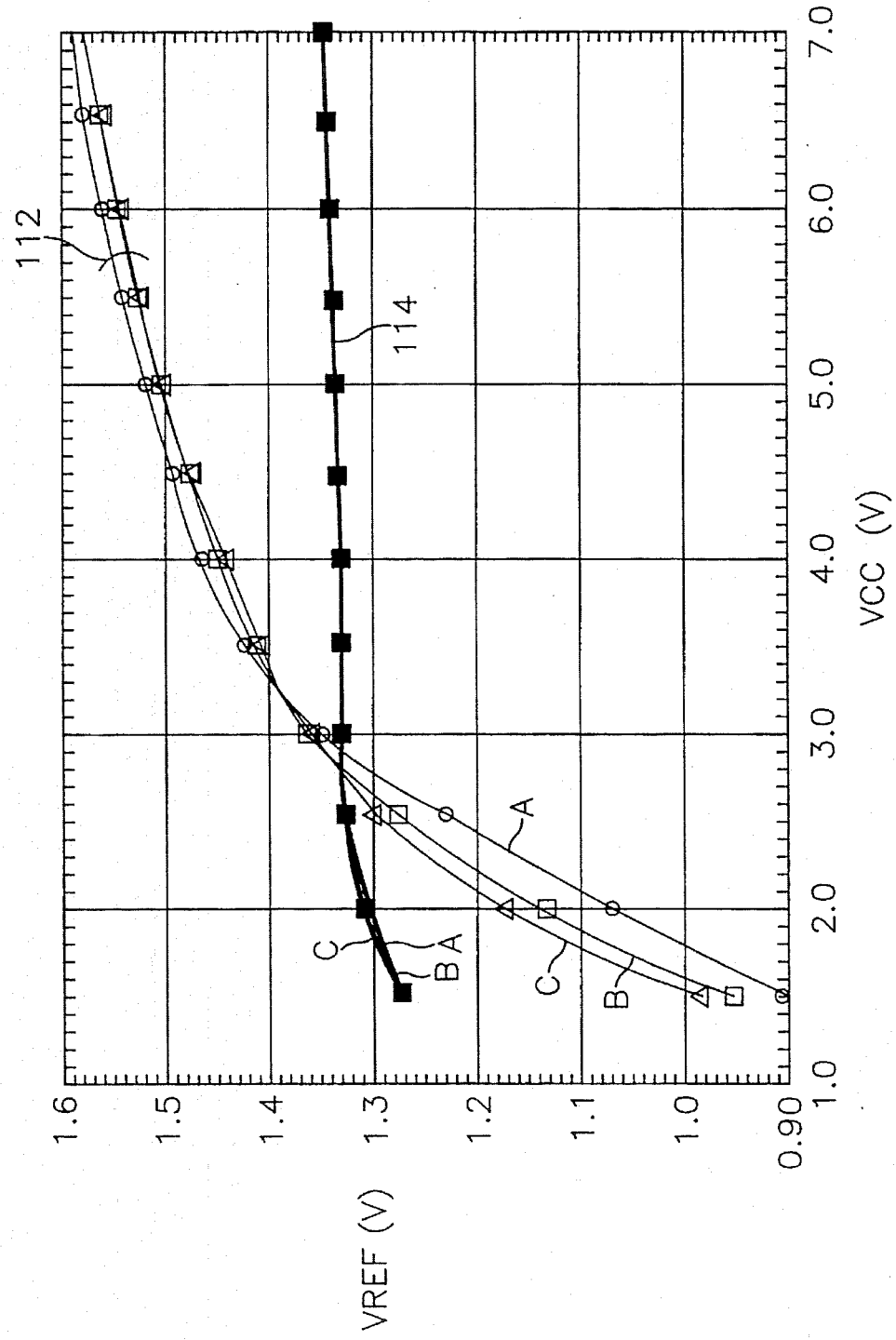
FIG. 6 is a graph illustrating the reference voltage versus the source voltage characteristic curves of the inventive reference voltage generating circuit compared to the conventional band-gap reference voltage generating circuit; and, FIGS. 7A to 7C are schematic diagrams of reference voltage generating circuits constructed in accordance with various other embodiments of the present invention, respectively.

With reference to FIG. 6, the curve 112 represents the characteristics of the conventional band-gap reference voltage generating circuit and the curve 114 those of the inventive circuit. As can be readily seen, while the inventive circuit needs a low set-up voltage and provides a substantially stable reference voltage Vref with variations of temperature and the external source voltage level, the conventional circuit needs a high set-up voltage and provides an unstable reference voltage Vref with variations of temperature and the external source voltage level.

Although several preferred embodiments of the present invention have been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed:

1. A reference voltage generating circuit, comprising:

a source voltage terminal connected to an external source voltage;

a ground terminal;

a reference voltage terminal at which a reference voltage is apparent;

a first resistor connected between said source voltage terminal and said reference voltage terminal;

a second resistor connected between said reference voltage terminal and a node;

a first MOS transistor of first conductivity type having a channel, said channel having a predetermined resistance and being connected between said node and said ground voltage terminal, and a gate connected to said source voltage terminal; and, a second MOS transistor of second conductivity type having a predetermined threshold voltage, a channel connected between said reference voltage terminal and said ground voltage terminal, and a gate connected to said node.

2. A reference voltage generating circuit as defined in claim 1, further comprising a third MOS transistor having a channel connected between said node and the drain of said first MOS transistor and a gate connected to said reference voltage terminal.

3. A reference voltage generating circuit as defined in claim 1, further comprising a third MOS transistor of said first conductivity type having a channel connected in parallel to said channel of said first MOS transistor and a gate connected to said reference voltage terminal.

4. A reference voltage generating circuit as defined in claim 2 or 3, further comprising a fourth MOS transistor of said second conductivity type having a channel connected in parallel to said channel of said second MOS transistor and a gate connected to the drain of said first MOS transistor.

5. A reference voltage generating circuit as defined in claim 1, wherein said first conductivity type is N-type and said second conductivity type is P-type.

6. A reference voltage generating circuit as defined in claim 4, wherein said reference voltage generating circuit is integrated in a semiconductor device having a substrate, and wherein a portion of said substrate corresponding to said second MOS transistor is connected to said reference voltage terminal.

7. A reference voltage generating circuit as defined in claim 2 or 3, wherein said reference voltage generating circuit is integrated in a semiconductor device having a substrate, and first and second portions of said substrate corresponding respectively to said first and third MOS transistors are connected in common to said ground terminal.

8. A reference voltage generating circuit as defined in claim 1, wherein said first predetermined channel resistance of said first MOS transistor has a positive thermal coefficient.

9. A reference voltage generating circuit as defined in claim 8, wherein said predetermined voltage threshold of said second MOS transistor has a negative thermal coefficient.

10. A circuit for converting a first source voltage to a second source voltage, comprising:

a positive thermal compensation MOS circuit connected between said first source voltage and a reference voltage and having a positive thermal coefficient for positively compensating said second source voltage with respect to temperature variation;

a negative thermal compensation MOS circuit responsive to the output of said positive thermal compensation circuit and having a negative thermal coefficient for negatively compensating said second source voltage with respect to temperature variation;

wherein said positive and negative thermal coefficients counterbalance each other so as to stabilize said second source voltage.

11. The circuit as defined in claim 10, further comprising a feed-back means for feeding-back said second source voltage to said positive thermal compensation circuit to assist in stabilizing said second source voltage.

12. The circuit as defined in claim 11, wherein said positive thermal compensation circuit comprises a first resistor, a second resistor and a first MOS transistor of first conductivity type, said first and second resistors and the channel of said first MOS transistor being connected in series between said first source voltage and said reference voltage.

13. The circuit as defined in claim 12, wherein said negative thermal compensation circuit comprises a second MOS transistor of second conductivity type having a channel connected between said second source voltage and said reference voltage, a gate connected to the drain of said first MOS transistor, wherein said reference voltage generating circuit is integrated in a semiconductor device having a substrate, said substrate being connected to said second source voltage.

14. The circuit as defined in claim 13, wherein said feed-back means comprises a third MOS transistor of said first conductivity type and having a channel connected between the gate of said second MOS transistor and the drain of said first MOS transistor, and a gate connected to said second source voltage.

15. A MOS circuit generating a reference voltage having a lower potential than an external source voltage, comprising:

a first resistor connected between said external voltage source and a terminal in said circuit at which said reference voltage is apparent;

a second resistor connected between said reference voltage terminal and a node;

a first MOS transistor of first conductivity type having a channel connected between said node and a ground voltage, and having a gate connected to said external source voltage, said first MOS transistor having a positive thermal coefficient; and, a second MOS transistor of second conductivity type having a channel connected between said reference voltage terminal and said ground voltage, a gate connected to said node, said second MOS transistor having a negative thermal coefficient.

16. A reference voltage generating circuit as defined in claim 15, further comprising a third MOS transistor of said first conductivity type whose channel is connected in series between said node and the drain of said first MOS transistor, and whose gate is connected to said reference voltage.

17. A reference voltage generating circuit as defined in claim 15, further comprising a third MOS transistor of said first conductivity type whose channel is connected in parallel to the channel of said first MOS transistor, and whose gate is connected to said reference voltage.

* * * * *